United States Patent [19]

Choi et al.

[11] Patent Number: 5,595,936
[45] Date of Patent: Jan. 21, 1997

[54] METHOD FOR FORMING CONTACTS IN SEMICONDUCTOR DEVICE

[75] Inventors: Kyeong K. Choi; Choon H. Kim, both of Kyungki-do, Rep. of Korea

[73] Assignee: Hyundai Electronics Industries Co., Ltd., Rep. of Korea

[21] Appl. No.: 512,141

[22] Filed: Aug. 7, 1995

Related U.S. Application Data

[63] Continuation-in-part of Ser. No. 285,972, Aug. 4, 1994, abandoned.

[30] Foreign Application Priority Data

Aug. 4, 1993 [KR] Rep. of Korea ............... 1993-15113

[51] Int. Cl.$^6$ ........................................... H01L 21/283
[52] U.S. Cl. ........................ 437/192; 437/195; 437/246; 427/124
[58] Field of Search ........................ 437/189, 192, 437/195, 245, 246; 427/97, 124, 255.1; 257/763, 383

[56] References Cited

U.S. PATENT DOCUMENTS

| | | | |
|---|---|---|---|
| 4,866,009 | 9/1989 | Matsuda | 437/203 |
| 4,951,601 | 8/1990 | Maydan et al. | 118/719 |
| 5,026,666 | 6/1991 | Hills et al. | 437/195 |
| 5,210,053 | 5/1993 | Yamagata | 437/192 |
| 5,223,084 | 6/1993 | Uesato et al. | 156/644 |
| 5,264,038 | 11/1993 | Hara et al. | 118/719 |
| 5,356,722 | 10/1994 | Nguyen et al. | 427/569 |
| 5,391,394 | 2/1995 | Hansen | 427/124 |

FOREIGN PATENT DOCUMENTS 4-56317  2/1992  Japan .

*Primary Examiner*—T. N. Quach
*Attorney, Agent, or Firm*—Merchant, Gould, Smith, Edell, Welter & Schmidt

[57] ABSTRACT

A method for forming contacts of a semiconductor device, capable of simultaneously forming metal plugs having a uniform thickness in contact holes respectively formed at $P^+$ and $N^+$ impurity-diffused regions of a semiconductor substrate, thereby minimizing the formation of poor contacts and simplifying the formation of contacts. The method includes the steps of forming a metal pad having a small thickness only at the $N^+$ impurity-diffused region, where a severe eroding reaction occurs, compared to the $P^+$ impurity-diffused region, by use of a reacting gas at a low temperature, and then depositing tungsten on all contact regions by use of reacting gases at a high temperature.

4 Claims, 1 Drawing Sheet

METHOD FOR FORMING CONTACTS IN SEMICONDUCTOR DEVICE

This application is a continuation-in-part of Ser. No. 08/285,972 filed Aug. 4, 1994, abandoned.

BACKGROUND OF THE INVENTION

1. Field of the Invention

The present invention relates to a method for forming contacts in a semiconductor device, and more particularly to a method for forming contacts, capable of minimizing the formation of poor contacts by utilizing the phenomenon of deposition difference of tungsten (W) between $P^+$ contacts and $N^+$ contacts.

2. Description of the Prior Art

Generally, the aspect ratio of a contact hole in a semiconductor device is generally increased as the semiconductor device has a higher integration degree. This is because the contact hole has a relatively increased depth due to a decrease in the width thereof. Such an increase in aspect ratio results in a poor contact between conduction wirings formed above and beneath the contact hole.

In order to minimize the generation of poor contacts, a proposal has been made wherein a metal plug is formed in a contact hole prior to the formation of the upper conduction wiring. The formation of the metal plug is typically achieved by filling tungsten in the contact hole using a deposition method. For depositing the tungsten on the inner surface of the contact hole, a chemical reactor containing a reacting gas mixture of $WF_6$ and $H_2$ or $WF_6$ and $SiH_4$ is used.

The $WF_6$ component of the reacting gas mixture of $WF_6$ and $H_2$ or $WF_6$ and $SiH_4$ reacts preferentially with silicon atoms on a silicon substrate surface exposed by the contact hole, as expressed by the following reaction (1), thereby depositing tungsten on the silicon substrate surface consuming the silicon atoms:

$$2WF_6 + 3Si \rightarrow 2W + 3SiF_4 \qquad (1)$$

Thereafter, the components $WF_6$ and $H_2$ or the components $WF_6$ and $SiH_4$ of the reacting gas mixture react with each other, as expressed by the following reactions (2) and (3), thereby sufficiently depositing tungsten on the inner surface of the contact hole to form a metal plug:

$$WF_6 + 3H_2 \rightarrow \text{tungsten} + 6HF \qquad (2)$$

$$2WF_6 + 3SiH_4 \rightarrow 2W + 3SiF_4 + 6H_2 \qquad (3)$$

Where the tungsten is deposited in accordance with the reaction of formula (1), however, the silicon substrate surface may be excessively eroded. There may also be a problem that the tungsten is deposited in the form of a tunnel. If the silicon substrate is excessively eroded during the procedure expressed in formula (1), the electrical characteristic of the silicon substrate is seriously affected resulting in failure of the proper functioning of the semiconductor device.

In particular, where tungsten is deposited at $P^+$ and $N^+$ impurity-diffused regions under a high temperature condition such as above 300° C., for example, the eroding phenomenon is more severe at the $N^+$ impurity-diffused region than at the $P^+$ impurity-diffused region. On the other hand, where it is attempted to deposit tungsten at $P^+$ and $N^+$ impurity-diffused regions under a low temperature condition such as below 300° C., for example, the tungsten plug deposited on the $P^+$ impurity-diffused region is nonexistent or has a thickness smaller than the tungsten plug deposited on the $N^+$ impurity-diffused region. As a result, a poor contact may be formed upon depositing aluminum at a subsequent step since the thickness of tungsten deposited at both $P^+$ and $N^+$ impurity-diffused regions are different from each other. This is because the tungsten plug formed at the $P^+$ impurity-diffused region is grown at a lower rate than the tungsten plug formed at the $N^+$ impurity-diffused region. Although the reason why tungsten is not grown on the $P^+$ impurity-diffused region at a lower temperature such as below 300° C. is not clear, many investigations show poor or no deposition of tungsten on the $P^+$ impurity-diffused region at such a lower temperature. It is believed that such difference of the deposition depth of tungsten will be caused by the difference of eroding depth of the silicon substrate between $P^+$ and $N^+$ impurity-diffused regions during the course of reaction expressed in formula (1).

It is more desirable to deposit tungsten on the $P^+$ and $N^+$ impurity-diffused regions without eroding the silicon substrate in order to avoid any degradation in the electrical property of the silicon substrate. However, there has not been proposed any method to deposit tungsten on the $P^+$ and $N^+$ impurity-diffused regions without eroding the silicon substrate. Therefore, it is more desirable to deposit the tungsten on the $P^+$ and $N^+$ impurity-diffused regions with minimum eroding of the silicon substrate at the state of the art.

In order to prevent such a problem, the contact hole formation and the tungsten deposition are conventionally implemented for the $N^+$ and $P^+$ impurity-diffused regions respectively so as to form uniform metal plugs at the impurity-diffused regions. As a result, the conventional method of forming metal plugs involves the problem that masking and etching steps are repeated twice.

SUMMARY OF THE INVENTION

Therefore, an object of the present invention is to provide a method for forming contacts in a semiconductor device, capable of simultaneously forming metal plugs having a uniform thickness in contact holes respectively formed at $P^+$ and $N^+$ impurity-diffused regions of a semiconductor substrate, thereby minimizing the formation of poor contacts and simplifying the formation of contacts.

The inventor found through much experimentation that tungsten is either not deposited or is poorly deposited on impurity-diffused regions have some thickness under methods executed at such lower temperatures. Therefore, the object of the present invention is to provide a method for forming contacts in a semiconductor device, by utilizing the results of such experimentation, comprising the steps of:

preparing a semiconductor substrate having a $P^+$ impurity-diffused region and an $N^+$ impurity-diffused region;

forming an insulating layer over the semiconductor substrate;

selectively removing the insulating film, thereby forming contact holes exposing respective portions of the $P^+$ and $N^+$ impurity diffused regions;

a first step for forming a metal pad on the exposed portion of the $N^+$ impurity-diffused region under the temperature condition that said metal is deposited only on said $N^+$ impurity-diffused region and not deposited on said P⁺ impurity-diffused region while supplying a reacting gas consisting of $WF_6$;

a second step for forming metal plugs having a uniform thickness in the contact holes, under the temperature condition that tungsten is grown on both the metal pads formed on said N⁺ impurity-diffused region while supplying reacting gases consisting of $WF_6$ and $SiH_4$; and forming a metal material layer over the insulating layer, the metal material layer being electrically connected with the metal plugs.

According to another aspect of the invention, the method for forming contacts in a semiconductor device is comprised of the steps of: preparing a semiconductor substrate having a P⁺ impurity-diffused region and an N⁺ impurity-diffused region; forming an insulating layer over the semiconductor substrate; selectively removing the insulating film, thereby forming contact holes exposing respective portions of the P⁺ and N⁺ impurity diffused regions; a first step for forming a metal pad on the N⁺ impurity-diffused region by supplying $WF_6$ gas under the temperature condition that the P⁺ impurity-diffused region has no metal deposition; a second step for forming metal plugs having a uniform thickness in the contact holes, through which the N⁺ and P⁺ impurity-diffused regions are exposed under the temperature condition that both of the N⁺ and P⁺ impurity-diffused regions are deposited simultaneously with the tungsten and supplied with reacting gases of $WF_6$ and $SiH_4$; and forming a metal layer over the insulating layer, the metal layer being electrically connected with the metal plugs.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1:
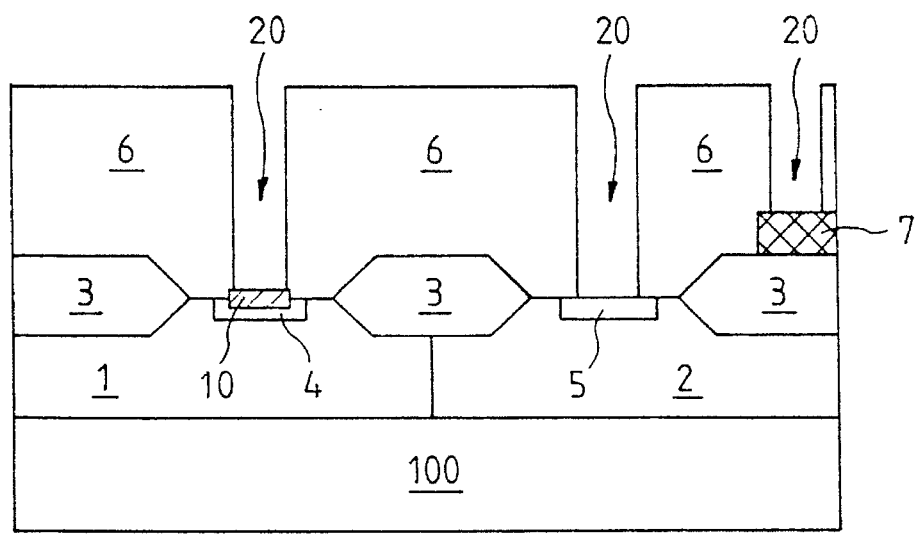
FIGS. 1 and 2 are respective sectional views of a semiconductor device, explaining a method for forming contacts in a semiconductor device.
Figure 2:
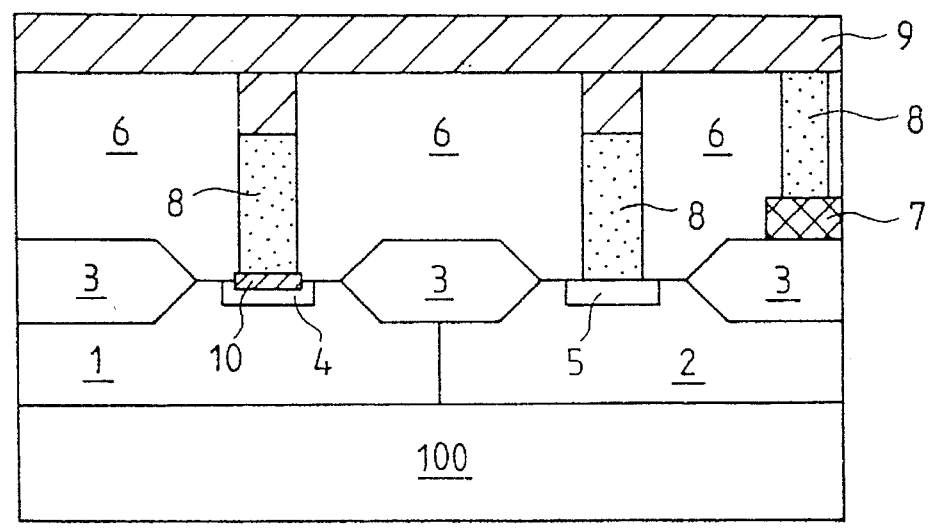

FIGS. 1 and 2 are respective sectional views of a semiconductor device, explaining a method for forming contacts in a semiconductor device.

As shown in FIG. 1, the semiconductor device includes a semiconductor substrate 100 having a P⁺ well 1 and an N⁺ well 2 at its surface, and an element isolation film 3 formed on the surface of the semiconductor substrate 100. The element isolation film 3 is adapted to isolate element regions, where elements such as transistors are formed, from one another. The element regions are defined in regions where the P⁺ and N⁺ wells 1 and 2 are formed. Sequentially formed at the element regions of the semiconductor substrate 100 are a conduction wiring 7 such as a gate or word line, an N⁺ impurity-diffused region 4 and a P⁺ impurity-diffused region 5. The N⁺ impurity-diffused region 4 is formed by implanting N⁺ impurity ions in the P⁺ well 1 whereas the P⁺ impurity-diffused region 5 is formed by implanting P⁺ impurity ions in the N⁺ well 2. The semiconductor device also includes an insulating layer 6. This insulating layer 6 is formed by depositing an insulating material over the entire exposed surface of the resulting structure obtained after the impurity-diffused regions 4 and 5 are formed and selectively removing the deposited insulating layer by use of a mask so as to form contact holes 20 for exposing the conduction wiring 7 and the P⁺ and N⁺ impurity-diffused regions 5 and 4.

The semiconductor device further includes a metal pad 10 at the N⁺ impurity-diffused region exposed through the contact hole 20. The metal pad 10 is formed by depositing tungsten in a first step. According to the preferred embodiment of the invention, the first step of depositing tungsten on the N⁺ impurity-diffused region is performed by maintaining the deposition temperature for depositing the tungsten at a temperature of 200° to 270° C. and supplying $WF_6$ gas of not more than 20 SCCM. As described above, when the first step for depositing tungsten is carried out while both the P⁺ and N⁺ impurity-diffused regions 5 and 4 are exposed, the P⁺ impurity-diffused regions 5 have no deposition of tungsten. The following Table 1 shows the results of the test executed by varying the condition of the deposition temperature of tungsten.

TABLE 1

| Deposition Temp. | P⁺ type | N⁺ type |
| --- | --- | --- |
| 300° C. |  | 50Å |
| 350° C. | 50Å | 150Å |
| 400° C. | 175Å | 250Å |

The results of Table 1 show that the tungsten is not deposited on the P⁺ impurity-diffused regions 5 at the temperature of 300° C. According to the inventor's test, the silicon atoms contained in the P⁺ impurity-diffused regions 5 are either not or are rarely eroded during the deposition process under the deposition temperature below 300° C., i.e., the reaction as stated in reaction (1) above has not occurred. Therefore, there is either no or is little tungsten deposition on the P⁺ impurity-diffused regions 5 since the $WF_6$ gas does not react with the silicon atoms positioned in that portion. At this time, tungsten is not deposited over the metal wiring also exposed through the contact hole 20, while the tungsten is deposited over the N⁺ impurity-diffused region 4. This evidently would not affect the electrical property of the semiconductor substrate in the N⁺ impurity-diffused region 4 compared to the process in which tungsten is deposited at a temperature above 300° C., e.g., since the N⁺ impurity-diffused region 4 is more deteriorated than the P⁺ impurity-diffused region 5 at that treating temperature as shown in Table 1. During the first step for depositing tungsten on the opened contact hole, the tungsten thickness deposited on the N⁺ impurity-diffused region 4 is about 50 Å according to the preferred embodiment of the invention.

FIG. 2 illustrates the second step of the preferred embodiment according to the present invention. The second step of the present invention is carried out under the condition that tungsten is grown on the pad deposited on the N⁺ impurity-diffused region 4 and the P⁺ impurity-diffused region 5. As discussed above, the N⁺ impurity-diffused region 4, which is more affectable by relative high temperatures than the P⁺ impurity-diffused region 5, is covered with the metal pad, especially tungsten, in the first step. Therefore, the relative high temperature used in the second step would not attack the N⁺ impurity-diffused region 4. Referring to FIG. 2, there are shown metal plugs 8 respectively buried in the contact holes 20 through which the metal pad 10 formed in said first step and the P⁺ impurity-diffused regions 5 are exposed. The metal plugs 8 are formed by depositing tungsten in the contact holes 20 by use of a relatively high temperature deposition process, for example, above 300° C. According to the preferred embodiment of the invention, the second step is processed by the condition of supplying the reacting gases of $WF_6$ and $SiH_4$ (or $H_2$) at a temperature of 300° to 400° C., e.g., for 50 to 110 seconds. At this time, silicon atoms are prevented from penetrating the $N^+$ impurity-diffused region 4 by the conduction pad 10 as discussed above. The metal plugs 8 being deposited at the $P^+$ impurity-diffused region 5 are uniformly grown by virtue of the high temperature, even though a foreign substance is present at the surface of the $P^+$ impurity-diffused region 5. The reduction thickness of silicon penetrating the $P^+$ impurity-diffused region 5 is so small as to be about 200 Å at a temperature of 350° to 400° C.

After the second step is ended, a metal wiring layer 9 is disposed over the resulting structure including the contact holes 20 buried with the metal plugs 8 and the insulating layer 6. The metal wiring layer 9 is formed by depositing aluminum. The metal wiring layer 9 is electrically connected with the conduction wiring 7 and the $N^+$ and $P^+$ impurity-diffused regions 4 and 5 via the metal plugs 8.

It is desired when the first step is accomplished that the semiconductor substrate 100 is conveyed to a place, where the second step is carried out, in a buffering condition provided by an argon gas. The buffering environment serves to prevent the conduction pad 10 from being oxidized and contaminated by atmosphere.

As apparent from the above description, the present invention provides a method for forming contacts in a semiconductor device, capable of simultaneously forming metal plugs having a uniform thickness at $P^+$ and $N^+$ impurity-diffused regions by forming a metal pad having a small thickness at the $N^+$ impurity-diffused region exposed through a contact hole at a low temperature and then depositing tungsten on the $P^+$ impurity-diffused region and the metal pad exposed through contact holes. Accordingly, it is possible to minimize the formation of poor contacts between upper and lower conduction wirings and to simplify the formation of contacts.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming contacts in a semiconductor device, comprising the steps of:

preparing a silicon substrate having a $P^+$ impurity-diffused region and an $N^+$ impurity-diffused region;

forming an insulating layer over the silicon substrate;

selectively removing the insulating film, thereby forming contact holes exposing respective portions of the $P^+$ and $N^+$ impurity diffused regions;

a first step of forming a metal pad on the exposed portion of the $N^+$ impurity diffused region under a first temperature condition of 200° C. to 300° C. and using a reacting gas consisting of $WF_6$ so that tungsten is deposited to form the metal pad only on said $N^+$ impurity diffused region and is not deposited on said $P^+$ impurity-diffused region;

a second step of forming tungsten metal plugs having a uniform thickness in the contact holes, under a second temperature condition that tungsten is grown on the tungsten metal pad formed on said $N^+$ impurity-diffused region and is grown on said $P^+$ impurity-diffused region in one of said contact holes exposing said $P^+$ impurity-diffused region by supplying reacting gases consisting of $WF_6$ and $SiH_4$; and forming a metal material layer over the insulating layer, the metal material layer being electrically connected with the tungsten metal plugs.

2. A method in accordance with claim 1, wherein the first step is carried out at a first temperature of 200° to 270° C.

3. A method in accordance with claim 1, wherein the second step is carried out at a second temperature of 300° to 400° C.

4. A method in accordance with claim 1, further comprising the step of carrying the silicon substrate obtained after the first step, in an argon buffering environment, to a place for executing the second step.

* * * * *

UNITED STATES PATENT AND TRADEMARK OFFICE
CERTIFICATE OF CORRECTION

PATENT NO. : 5,595,936

DATED : Jan. 21, 1997

INVENTOR(S) : Choi et al.

It is certified that error appears in the above-identified patent and that said Letters Patent is hereby corrected as shown below:

In column 2, line 49, insert --the $P^+$ impurity diffused regions at lower temperatures, whereas ngsten deposited on $N^+$-- after the word "on".

Signed and Sealed this

Twenty-first Day of October 1997

Attest:

BRUCE LEHMAN

Attesting Officer     Commissioner of Patents and Trademarks